United States Patent
Chung et al.

(10) Patent No.: US 12,176,917 B2
(45) Date of Patent: Dec. 24, 2024

(54) APPARATUS AND METHOD FOR CHECKING AN ERROR IN A BIT-FLIPPING DECODER

(71) Applicant: SK hynix Inc., Gyeonggi-do (KR)

(72) Inventors: Bi Woong Chung, Gyeonggi-do (KR); Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/307,806

(22) Filed: Apr. 27, 2023

(65) Prior Publication Data
US 2024/0204799 A1 Jun. 20, 2024

(30) Foreign Application Priority Data
Dec. 19, 2022 (KR) .................. 10-2022-0178266

(51) Int. Cl.
*H03M 13/11* (2006.01)
(52) U.S. Cl.
CPC .... *H03M 13/1108* (2013.01); *H03M 13/1128* (2013.01); *H03M 13/1177* (2013.01)
(58) Field of Classification Search
CPC ......... H03M 13/1108; H03M 13/1128; H03M 13/1177
See application file for complete search history.

(56) References Cited

U.S. PATENT DOCUMENTS

| | | | |
|---|---|---|---|
| 10,263,640 B2 | 4/2019 | Djurdjevic et al. | |
| 10,339,004 B2 | 7/2019 | Kang | |
| 11,005,499 B2 | 5/2021 | Kim et al. | |
| 11,184,024 B2 | 11/2021 | Xiong et al. | |
| 2020/0210274 A1 | 7/2020 | Kim et al. | |
| 2021/0250045 A1* | 8/2021 | Ha | .......... H03M 13/1108 |

OTHER PUBLICATIONS

Yu Kou et al., Low Density Parity Check Codes Based on Finite Geometries: A Rediscovery, ISIT (International Symposium on Information Theory) 2000, Jun. 25-30, 2000, pp. 200, IEEE, Sorrento, Italy.
Yu Kou et al., Low-Density Parity-Check Codes Based on Finite Geometries: A Rediscovery and New Results, IEEE Transactions on Information Theory, Nov. 2001, pp. 2711-2736, vol. 47, No. 7.
Juntan Zhang et al., A Modified Weighted Bit-Flipping Decoding of Low-Density Parity-Check Codes, IEEE Communications Letters, Mar. 2004, pp. 165-167, vol. 8, No. 3.

(Continued)

*Primary Examiner* — Thien Nguyen
(74) *Attorney, Agent, or Firm* — IP & T GROUP LLP

(57) ABSTRACT

A memory system includes a memory device and a controller. The memory device outputs a codeword read from plural memory cells in response to a request. The controller is configured to establish a plurality of variable nodes and a plurality of check nodes from the codeword, perform a second flipping function operation for estimating flipping necessity and flipping frequency regarding the plurality of variable nodes based on the plurality of check nodes, determine, based on the flipping necessity and the flipping frequency, which iterative operation is performed during a first flipping operation for decoding the codeword, and perform the first flipping operation through a determined iterative operation to obtain the plurality of variable nodes.

20 Claims, 13 Drawing Sheets

(56) References Cited

OTHER PUBLICATIONS

Khoa Le et al., A Probabilistic Parallel Bit-Flipping Decoder for Low-Density Parity-Check Codes, IEEE Transactions on Circuits and Systems I: Regular Papers, 2018, pp. 1-14.
Jun Lin et al., An Improved Min-Sum Based col. Layered Decoding Algorithm for LDPC Codes, 2009 IEEE Workshop on Signal Processing Systems, 2009, pp. 238-242.

* cited by examiner

APPARATUS AND METHOD FOR CHECKING AN ERROR IN A BIT-FLIPPING DECODER

CROSS-REFERENCE TO RELATED APPLICATIONS

This patent application claims priority under 35 U.S.C. § 119(e) of Korean Patent Application No. 10-2022-0178266, filed on Dec. 19, 2022, the entire disclosure of which is incorporated herein by reference.

TECHNICAL FIELD

Various embodiments of the present disclosure described herein relate to a memory system, and more particularly, to an apparatus and a method for improving data safety in the memory system.

BACKGROUND

A data processing system, including a communication system, a memory system, or a data storage device, is developed to store more data in a memory device and transfer data stored in data storage devices more quickly. The memory device may include nonvolatile memory cells and/or volatile memory cells for storing data.

Various communication systems and data processing systems may present high requirements for complexity and performance of low-density parity-check (LDPC) decoders. A bit-flipping decoder may be suitable for such applications. Column layered scheduling may be a way to increase convergence speed and may improve error correction performance. Further, layered decoding may lead to improved decoding performance with low computational complexity in LDPC decoder implementations.

BRIEF DESCRIPTION OF THE DRAWINGS

The description herein makes reference to the accompanying drawings wherein like reference numerals refer to like parts throughout the figures.

DETAILED DESCRIPTION

Figure 1:
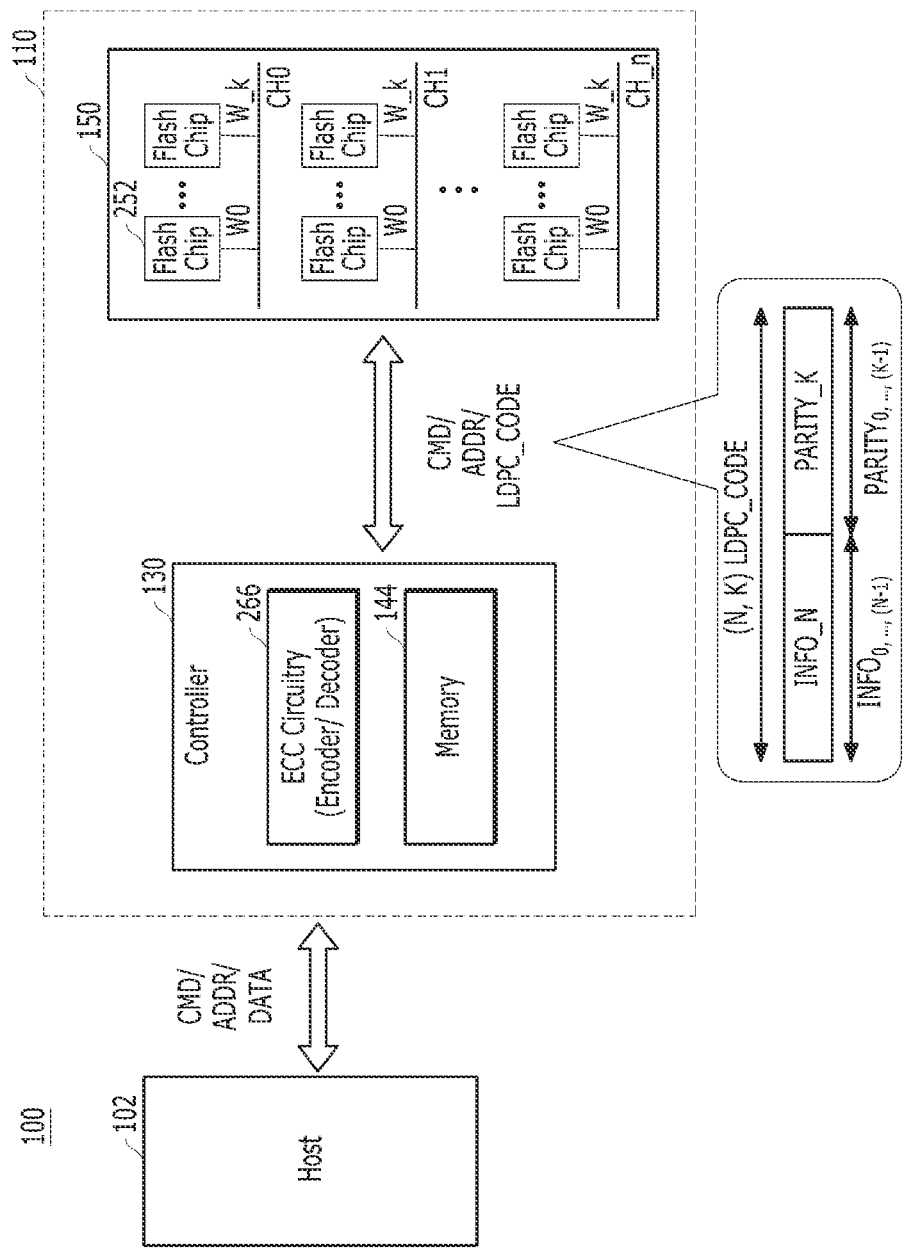
FIG. 1 describes a data processing system according to an embodiment of the present invention.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational e.g., is not turned on nor activated. The block/unit/circuit/component used with the "configured to" language include hardware for example, circuits, memory storing program instructions executable to implement the operation, etc. Additionally, "configured to" can include a generic structure e.g., generic circuitry, that is manipulated by software and/or firmware e.g., an FPGA or a general-purpose processor executing software to operate in manner that is capable of performing the task(s) at issue. "Configured to" may also include adapting a manufacturing process e.g., a semiconductor fabrication facility, to fabricate devices e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the present invention may provide a memory device, a memory system, a controller included in the memory system, a data processing system including the memory system or the memory device, or a communication system for transmitting data.

In an embodiment of the present invention, a memory system can include a memory device configured to output a codeword read from plural memory cells in response to a request; and a controller configured to: establish a plurality of variable nodes and a plurality of check nodes from the codeword; perform a second flipping function operation for estimating flipping necessity and flipping frequency regarding the plurality of variable nodes based on the plurality of check nodes; determine, based on the flipping necessity and the flipping frequency, which iterative operation is performed during a first flipping operation for decoding the codeword; and perform the first flipping operation regarding a determined iterative operation to obtain the plurality of variable nodes.

The controller can include a second flipping machine manager configured to determine a second iterative operation index for the second flipping function operation; a second flipping machine configured to perform the second flipping function operation through second iterative operations corresponding to the second iterative operation index to estimate the flipping necessity and the flipping frequency; an index determination logic configured to determine a first iterative operation index for the first flipping operation based on the flipping necessity and the flipping frequency; a task queue configured to store the first iterative operation index; and a first flipping machine configured to perform the first flipping operation through the determined iterative operation corresponding to the first iterative operation index.

The index determination logic can be further configured to change or adjust the second iterative operation index based on the flipping necessity and the flipping frequency. The task queue can include plural queues for respectively storing the first iterative operation index and the second iterative operation index.

The second flipping machine manager can be configured to change or adjust the second iterative operation index based on a number of the iterative operation corresponding to the first iterative operation index stored in the task queue.

The controller can further include a first flipping machine manager configured to control the first flipping machine to perform the first flipping operation through the iterative operation corresponding to the first iterative operation index, and determine a range of the first flipping operation based on whether the second flipping function operation is performed by the second flipping machine.

The controller is configured to perform the first flipping operation using a two-bit weighted bit-flipping algorithm in which each of the plurality of variable nodes includes a value bit and a state bit; and perform the second flipping function operation using a column-layered group shuffled bit flipping algorithm that performs iterative operations in a unit of columns of a circulant permutation matrix (CPM).

A first threshold value used for flipping in the first flipping operation can be different from a second threshold value used for flipping estimation in the second flipping function operation.

The plurality of variable nodes shares a common state bit during the first flipping operation.

The controller can be configured to perform the second flipping operation by performing sub-iterations corresponding to a cycle of the circulant permutation matrix (CPM) to update the flipping necessity, a number of unsatisfied check nodes, and a second threshold value.

The controller can perform the first flipping operation starting from an iterative operation corresponding to a first column of a parity check matrix. The controller can perform the second flipping function operation starting from an iterative operation corresponding to a column located a predetermined number of columns apart from the first column in the parity check matrix.

In another embodiment of the present invention, a method for decoding a codeword can include establishing a plurality of variable nodes and a plurality of check nodes from the codeword; performing a second flipping function operation for estimating flipping necessity and flipping frequency regarding the plurality of variable nodes based on the plurality of check nodes; determining, based on the flipping necessity and the flipping frequency, which iterative operation is performed during a first flipping operation for decoding the codeword; and performing the first flipping operation through a determined iterative operation to obtain the plurality variable nodes.

The method can further include determining a second iterative operation index for the second flipping function operation. The second flipping function operation can be performed through second iterative operations corresponding to the second iterative operation index.

The determining which iterative operation is performed during the first flipping operation can include determining a first iterative operation index for the first flipping operation based on the flipping necessity and the flipping frequency; and storing the first iterative operation index in a task queue. The first flipping operation can include the iterative operation only corresponding to the first iterative operation index.

The method can further include changing or adjusting the second iterative operation index based on the flipping necessity and the flipping frequency.

The method can further include changing or adjusting the second iterative operation index based on a number of the iterative operation corresponding to the first iterative operation index stored in the task queue.

The first flipping operation can be performed based on a two-bit weighted bit-flipping algorithm in which each of the plurality of variable nodes includes a value bit and a state bit. The second flipping function operation can be performed based on a column-layered group shuffled bit-flipping algorithm that perform iterative operations in a unit of columns of a circulant permutation matrix (CPM).

The first flipping operation can be performed starting from an iterative operation corresponding to a first column of a parity check matrix/The second flipping function operation is performed starting from an iterative operation corresponding to a column located a predetermined number of columns apart from the first column in the parity check matrix.

In another embodiment of the present invention, a Low-Density Parity-Check (LPDC) decoder can include at least one processor and at least one memory having stored instructions operative, when executed by the at least one processor, to cause the LDPC decoder to: receive a codeword generated based on a parity check matrix; establish a plurality of variable nodes and a plurality of check nodes from the codeword; perform a second flipping function operation for estimating flipping necessity and flipping frequency regarding the plurality of variable nodes based on the plurality of check nodes; determine, based on the flipping necessity and the flipping frequency, which iterative operation is performed during a first flipping operation for decoding the codeword; and perform the first flipping operation through a determined iterative operation to obtain the plurality variable nodes.

The first flipping operation can be performed starting from an iterative operation corresponding to a first column of the parity check matrix. The second flipping function operation is performed starting from an iterative operation corresponding to a column located a predetermined number of columns apart from the first column of the parity check matrix.

The LDPC decoder can further include a task queue configured to store information corresponding the determined iterative operation to be performed during the first flipping operation, the determined iterative operations corresponding to a column of the parity check matrix and a result of the second flipping function operation.

In another embodiment, a decoding method can include performing, according to a column-layered group shuffled bit-flipping algorithm, a preceding low-density parity-check (LDPC) decoding operation on a codeword with a parity check matrix in units of columns; and performing, according to a two-bit weighted bit-flipping algorithm, a subsequent LDPC decoding operation on the codeword with the parity check matrix in units of columns. The subsequent LDPC decoding operation is performed with one or more selected columns of the parity check matrix based on a result of the preceding LDPC decoding operation with each of the columns of the parity check matrix. The column is a series of square sub-matrixes, each of which is one of a zero matrix and a circulant permutation matrix.

Embodiments will now be described with reference to the accompanying drawings, wherein like numbers reference like elements.

FIG. 1 describes a data processing system 100 according to an embodiment of the present invention.

Referring to FIG. 1, the data processing system 100 may include a host 102 engaged or coupled with a memory system 110. For example, the host 102 and the memory system 110 can be coupled to each other via a data bus, a host cable, and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips.

The controller 130 may perform a data input/output operation (such as a read operation, a program operation, an erase operation, or etc.) in response to a request or a command input from an external device such as the host 102. For example, when the controller 130 performs a read operation in response to a read request input from an external device, data stored in a plurality of non-volatile memory cells included in the memory device 150 is transferred to the controller 130. Further, the controller 130 can independently perform an operation regardless of the request or the command input from the host 102. Regarding an operation state of the memory device 150, the controller 130 can perform an operation such as garbage collection (GC), wear leveling (WL), a bad block management (BBM) for checking whether a memory block is bad and handing a bad block.

The memory device 150 can include plural memory chips 252 coupled to the controller 130 through plural channels CH0, CH1, . . . , CH1_n and ways W0, . . . , W_k. The memory chip 252 can include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells. Each memory plane or each memory die can support an interleaving mode in which plural data input/output operations are performed in parallel or simultaneously. According to an embodiment, memory blocks included in each memory plane, or each memory die, included in the memory device 150 can be grouped to input/output plural data entries as a super memory block. An internal configuration of the memory device 150 shown in the above drawing may be changed based on operating performance of the memory system 110. An embodiment of the present disclosure may not be limited to the internal configuration described in FIG. 1.

The controller 130 can control a program operation or a read operation performed within the memory device 150 in response to a write request or a read request entered from the host 102. According to an embodiment, the controller 130 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the controller 130 may be implemented with a microprocessor, a central processing unit (CPU), an accelerator, or the like. According to an embodiment, the memory system 110 may be implemented with at least one multi-core processor, co-processors, or the like.

The memory 144 may serve as a working memory of the memory system 110 or the controller 130, while temporarily storing transactional data for operations performed in the memory system 110 and the controller 130. According to an embodiment, the memory 144 may be implemented with a volatile memory. For example, the memory 144 may be implemented with a static random access memory (SRAM), a dynamic random access memory (DRAM), or both. The memory 144 can be disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

According to an embodiment, the controller 130 may further include ECC (error correction code) circuitry 266 configured to perform error checking and correction of data transferred between the controller 130 and the memory device 150. The ECC circuitry 266 may be implemented as a separate module, circuit, or firmware in the controller 130, but may also be implemented in each memory chip 252 included in the memory device 150 according to an embodiment. The ECC circuitry 266 may include a program, a circuit, a module, a system, or an apparatus for detecting and correcting an error bit of data processed by the memory device 150.

According to an embodiment, the ECC circuitry 266 can include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the ECC circuitry 266 can determine whether the error correction decoding has succeeded or not, and output an instruction signal, e.g., a correction success signal or a correction fail signal, based on a result of the error correction decoding. The ECC circuitry 266 may use a parity bit, which has been generated during the ECC encoding process for the data stored in the memory device 150, in order to correct the error bits of the read data entries. When the number of the error bits is greater than or equal to the number of correctable error bits, the ECC circuitry 138 may not correct the error bits and instead may output the correction fail signal indicating failure in correcting the error bits.

According to an embodiment, the ECC circuitry 266 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above-described codes.

According to an embodiment, the controller 130 and the memory device 150 may transmit and receive a command CMD, an address ADDR, or a codeword LDPC_CODE. For example, the codeword LDPC_CODE may be a codeword (N, K) LDPC_CODE including (N+K) bits or symbols. The codeword (N, K) LDPC_CODE may include an information word INFO_N and a parity PARITY_K. The information word INFO_N can include N bits or symbols $INFO_0, \ldots, INFO_{(N-1)}$, and the parity PARITY_K can include K bits or symbols $PARITY_0, \ldots, PARITY_{(K-1)}$. Here, N and K are natural numbers and may vary depending on a design of the LDPC code.

For example, if an input information word INFO_N including N bits or symbols $INFO_0, \ldots, INFO_{(N-1)}$ is LDPC-encoded, a codeword (N, K) LDPC_CODE can be generated. The codeword (N, K) LDPC_CODE may include (N+K) bits or symbols $LDPC\_CODE_0, \ldots, LDPC\_CODE_{(N+K)-1}$. The LDPC code can be a type of linear block code. A linear block code can be described by a generator matrix G or a parity check matrix H. As a feature of this LDPC code, most of the elements (e.g., entries) of the parity check matrix are made of 0, and the number of non-zero elements thereof is small as compared to a code length, so that iterative decoding based on probability could be possible. For instance, a first proposed LDPC code could be defined by a parity check matrix having a non-systematic form. The parity check matrix may be designed to have a uniformly low weight in its rows and columns. Here, a weight indicates the number of 1s included in a column or row of the parity check matrix.

For example, regarding all codewords (N, K) LDPC_CODE, characteristics of a linear code may satisfy Equation 1 or Equation 2 shown below.

$$LDPC\_CODE \cdot H^T = 0 \qquad \text{(Equation 1)}$$

$$H \cdot LDPC\_CODE^T = \\ [h_1 \; h_2 \; h_3 \; \cdots \; h_{(N+K)-1}] \cdot LDPC\_CODE^T = \sum_{i=0}^{(N-K)} LDPC\_CODE i \cdot h_i = 0 \qquad \text{(Equation 2)}$$

In the Equations 1 and 2, H denotes a parity check matrix, LDPC_CODE denotes a codeword, LDPC_CODEi denotes the i-th bit of the codeword, and (N+K) denotes a length of the codeword. Also, hi indicates an i-th column of the parity check matrix H. The parity check matrix H may include (N+K) columns equal to the number of bits of the LDPC codeword. The Equation 2 shows that the sum of the products of the i-th column hi of the parity check matrix H and the ith codeword bit LDPC_CODEi is '0', so the i-th column hi would be related to the ith codeword bit LDPC_CODEi.

Figure 2:
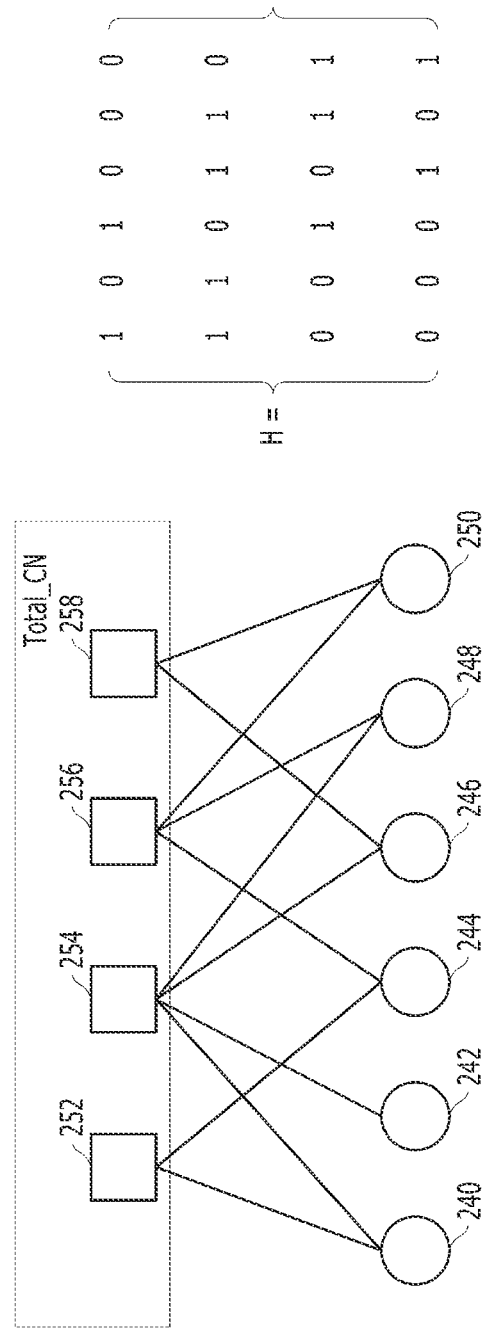
FIG. 2 describes a low-density parity-check (LDPC) code according to another embodiment of the present invention.

FIG. 2 describes a LDPC code according to another embodiment of the present invention.

FIG. 2 shows an example of a parity check matrix H of an LDPC code, which has 4 rows and 6 columns, and a Tanner graph thereof. Referring to FIG. 2, because the parity check matrix H has 6 columns, a codeword having a length of 6-bit can be generated. The codeword generated through H becomes an LDPC codeword, and each column of the parity check matrix H can correspond to each of 6 bits in the codeword.

Referring to FIG. 2, the Tanner graph of the LDPC code encoded and decoded based on the parity check matrix H can include 6 variable nodes 240, 242, 244, 246, 248, 250 and 4 check nodes 252, 254, 256, 258. Here, the i-th column and the j-th row of the parity check matrix H of the LDPC code correspond to the i-th variable node and the j-th check node, respectively. In addition, a value of 1 at the intersection of the j-th column and the j-th row of the parity check matrix H of the LDPC code (i.e., the meaning of the value other than 0) means that there is an edge connecting the i-th variable node and the j-th check node on the Tanner graph as shown in FIG. 2.

The degree of the variable node and the check node in the Tanner graph of the LDPC code means the number of edges (i.e., lines) connected to each node. The number of edges could be equal to the number of non-zero entries (e.g., 1s) in a column or row corresponding to the node in the parity check matrix of the LDPC code. For example, in FIG. 2, degrees of the variable nodes 240, 242, 244, 246, 248, 250 are 2, 1, 2, 2, 2, 2 in order, respectively. Degrees of the check nodes 252, 254, 256, 258 are 2, 4, 3, 2 in order, respectively. In addition, the number of non-zero entries in each column of the parity check matrix H of FIG. 2, corresponding to the variable nodes of FIG. 2, can coincide with the above-mentioned orders 2, 1, 2, 2, 2, 2 in order. The number of non-zero entries in each row of the parity check matrix H of FIG. 2, corresponding to the check nodes of FIG. 2, can coincide with the aforementioned orders 2, 4, 3, 2 in order.

The LDPC code can be used for a decoding process using an iterative decoding algorithm based on a sum-product algorithm on a bipartite graph listed in FIG. 2. Here, the sum-product algorithm is a type of message passing algorithm. The message passing algorithm can include operations or processes for exchanging messages through an edge on the bipartite graph and calculating and updating an output message from the messages input to a variable node or a check node.

Herein, a value of the i-th coded bit may be determined based on a message of the i-th variable node. Depending on an embodiment, the value of the i-th coded bit can be obtained through both a hard decision and a soft decision. Therefore, performance of the i-th bit ci of the LDPC codeword can correspond to performance of the i-th variable node of the Tanner graph, which can be determined according to positions of 1s and the number of 1s in the i-th column of the parity check matrix. In other words, performance of (N+K) codeword bits of a codeword can be influenced by the positions of 1s and the number of 1s in the parity check matrix, which means that the parity check matrix can greatly affect performance of the LDPC code. Therefore, a method for designing a good parity check matrix would be required to design an LDPC code with excellent performance.

According to an embodiment, for ease of implementation, a quasi-cyclic LDPC (QC-LDPC) code using a QC parity check matrix may be used as a parity check matrix. The QC-LDPC code is characterized by having a parity check matrix including zero matrices having a form of a small square matrix or circulant permutation matrices. In this case, the permutation matrix may be a matrix in which all entries of the square matrix are 0 or 1 and each row or column includes only one 1. Further, the cyclic permutation matrix may be a matrix obtained by circularly shifting each of the entries of the permutation matrix from the left to the right.

Figure 3:
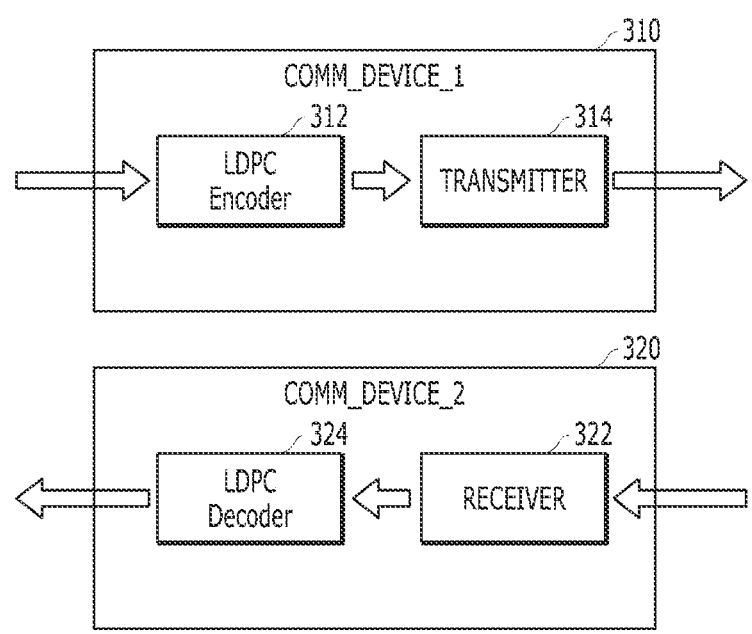
FIG. 3 describes a communication system according to another embodiment of the present invention.

FIG. 3 describes a communication system according to another embodiment of the present invention.

Referring to FIG. 3, the communication system may selectively include a first communication device 310 for transmitting signals or data and a second communication device 320 for receiving signals or data. The first communication device 310 may include an LDPC encoder 312 and a transmitter 314. The second communication device 320 may include a receiver 322 and an LDPC decoder 324. Herein, the LDPC encoder 312 and the LDPC decoder 324 may encode or decode signals or data based on the LDPC code described in FIG. 2.

Referring to FIGS. 1 and 3, components used for encoding or decoding signals or data based on the LDPC code can be implemented within the memory system 110 including the controller 130, the communication system including the communication devices 310, 320, or the data processing system 110 including the memory system 110, based on an operation, a configuration, and performance thereof.

According to an embodiment, when a decoding process is performed using a sum-product algorithm (SPA), a LDPC code may provide performance close to capacity performance. For hard-decision decoding, a bit-flipping (BF) algorithm based on a LDPC code has been proposed. A BF algorithm can flip a bit, symbol, or group of bits (e.g., change '0' to '1', or vice versa) based on a value of a flipping function (FF) computed at each iteration or each iterative operation. The FF associated with the variable node (VN) could be a reliability metric of the corresponding bit decision and may depend on a binary value (checksum) of the check node (CN) connected to the VN. The BF algorithm could be simpler than the sum-product algorithm (SPA), but the simpleness can make a difference in performance. To reduce this performance difference, various types of BF algorithms have been proposed. The BF algorithm can be designed to improve the FF, which is the reliability metric of the VN, and/or the method of selecting bits, symbols, or groups of bits to be flipped, thereby providing various degrees of bit error rate (BER) in response to reduction or increment of complexity or improving convergence rate performance.

Figure 4:
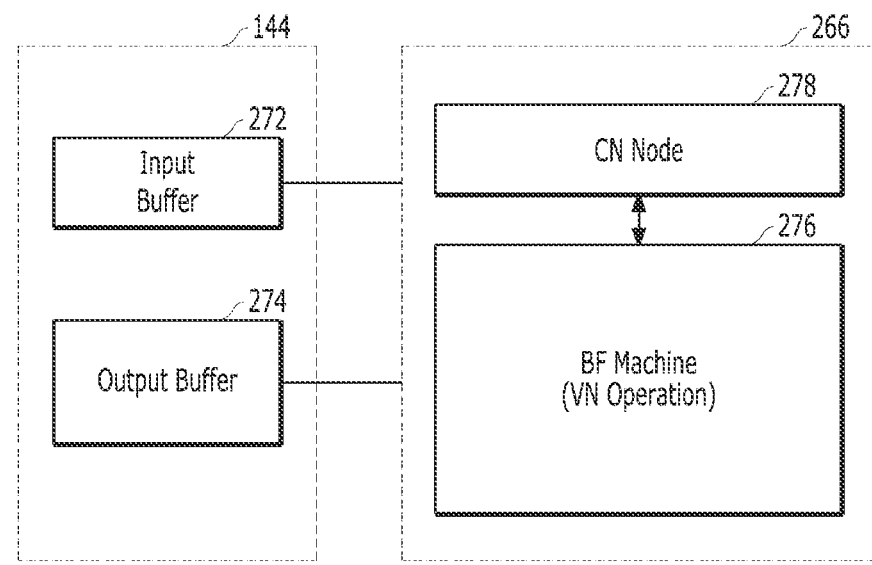
FIG. 4 describes an LDPC decoder according to another embodiment of the present invention.

FIG. 4 describes an LDPC decoder according to another embodiment of the present invention.

Referring to FIGS. 1 and 4, the controller 130 may include the memory 144 and the ECC circuitry 266. The ECC circuitry 266 may include an LDPC decoder. The LDPC decoder may include a BF machine 276. The codeword (N, K) LDPC_CODE transferred from the memory device 150 may include the information word INFO_N and the parity PARITY_K. The information word INFO_N can include N bits or symbols $INFO_0, \ldots, INFO_{(N-1)}$, and the parity PARITY_K can include K bits or symbols $PARITY_0, \ldots, PARITY_{(K-1)}$.

According to an embodiment, the LDPC decoder may establish a plurality of variable nodes and a plurality of check nodes 278. The number of variable nodes is proportional to the length (N+K) of the codeword (N, K) LDPC_CODE. The plurality of variable nodes can be stored in SRAM in the memory 144. The plurality of check nodes is proportional to the length K of the parity PARITY_K, and the plurality of variable nodes can be stored in registers. The registers can be used for storing relatively small size data, as compared to SRAM. There are almost no restrictions regarding the amount of access to data stored at the same time (e.g., memory width), as compared to SRAM. On the other hand, the register may have an advantage of lower power consumption than SRAM, when a small storage capacity is required and an amount of data access (e.g., memory width) is large. The ECC circuitry 266 can be configured to receive a plurality of variable nodes from an input buffer 272 in the memory 144, perform a decoding process through bit-flipping, and store a result of the decoding process in an output buffer 274.

The BF machine 276 can be configured to compare a value for each VN, which is calculated based on a flip function (FF) for calculating reliability of a current value bit using the number of unsatisfied check nodes (UCN) or channel information, with a threshold value and determine whether bit-flipping (correction of 0 to 1 or 1 to 0) is performed based on a comparison result.

Referring to FIGS. 1 to 4, the codeword (N, K) LDPC_CODE transmitted from the memory device 150 to the controller 130 may include an error for various reasons.

For example, an error occurs in a process of transmitting data through a data path (e.g., channel, way, etc.) from the memory device 150 to the controller 130 or transmitting the codeword (N, K) LDPC_CODE from the controller 130 to the memory device 150. In addition, as an integration degree of non-volatile memory cells in the memory device 150 increases and the number of bits of data stored in each non-volatile memory cell increases, an error may occur while the memory device 150 programs data into non-volatile memory cells or reads data stored in non-volatile memory cells. To detect and correct these errors, the ECC circuitry 266 in controller 130 may perform hard-decision decoding and/or soft-decision decoding. When performing soft-decision decoding based on a generalized LDPC (GLDPC) such as a Belief Propagation (BP) algorithm, the ECC circuitry 266 can provide good performance, but complexity due to an increased amount of computation performed to achieve great performance may make implementation of the controller 130 difficult. However, the complexity could be reduced by applying the BF algorithm to the hard-decision decoding.

The BP algorithm for decoding LDPC codes can update all VNs and CNs in parallel. However, a group shuffled belief propagation (GSBP) algorithm can divide a plurality of VNs into groups and sequentially performs parallel decoding per group, effectively converting an iteration or iterative operation into plural sub-iterations or sub-iterative operations. Therefore, a GSBP decoder can propagate newly updated messages obtained in sub-iterations to subsequent sub-iterations in neighboring groups, for achieving faster convergence with reduced parallel decoding complexity. The GSBP algorithm can generalize a column-layered based BP decoder by allowing a group to contain more than one VN. Similar to the BP algorithm, group shuffled and column-layered based decoding can be applied to the BF algorithm. Hereinafter, according to an embodiment, an apparatus or a method for reducing complexity by performing decoding processes based on different BF algorithms in parallel will be described.

Figure 5:
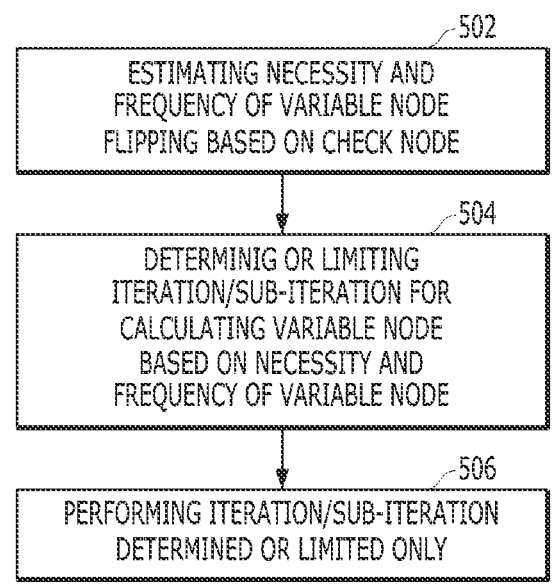
FIG. 5 describes an LDPC decoding method according to another embodiment of the present invention.

FIG. 5 describes an LDPC decoding method according to another embodiment of the present invention.

Referring to FIG. 5, the LDPC decoding method can include estimating flipping necessity and flipping frequency regarding VNs based on CNs (operation 502). According to an embodiment, the flipping necessity can indicate whether at least one of VNs should be flipped for correcting an error in the codeword, while the flipping frequency can indicate how much bit-flipping of the VNs could be performed for correcting an error. The LDPC decoding method can further include determining an iteration and/or a sub-iteration for calculating the VNs in response to the flipping necessity and the flipping frequency (operation 504) and performing a VN operation for the determined iteration and/or the determined sub-iteration (operation 506). Herein, the VN operation may include operations for searching for a VN requiring bit-flipping and determining the bit-flipping regarding a searched VN through the iteration and/or the sub-iteration.

Referring to FIGS. 1 and 5, different flipping functions may be performed on the codeword (N, K) LDPC_CODE transmitted from the memory device 150 to the controller 130. The operation (502) for estimating the flipping necessity and the flipping frequency regarding the VNs is referred as to a second flipping function operation. The operation (506) for performing the determined iteration and/or the determined sub-iteration for the VN operation is referred as to a first flipping operation. For example, from the codeword (N, K) LDPC_CODE transmitted from the memory device 150 to the controller 130, the controller 130 can establish the plurality of VNs and the plurality of CNs. The controller 130 performs a second flipping function operation to check the flipping necessity and the flipping frequency regarding a plurality of VNs based on the plurality of CNs (operation 502). In the operation (502), the bit-flipping may not occur for any VN. Then, an iterative operation to be performed during the first flipping operation for decoding the codeword (N, K) LDPC_CODE can be determined based on the flipping necessity and the flipping frequency (operation 504). The first flipping operation for performing the determined iterative operation is performed to obtain a plurality of VNs (operation 506).

According to an embodiment, the controller 130 can perform the first flipping operation using a two-bit weighted bit-flipping algorithm in which each of the plurality of VNs includes a value bit and a state bit. In addition, the controller 130 can perform the second flipping function operation using a column-layered group shuffled bit-flipping algorithm in units of columns each configured by circulant permutation matrixes (CPMs). The LDPC decoding method described in FIG. 5 would be distinguished from a decoding method for performing a same bit-flipping algorithm in parallel to reduce implementation complexity. The LDPC decoding method described in FIG. 5 can change, adjust, or limit iterations and/or sub-iterations in a first bit-flipping algorithm based on a result of performing a second bit-flipping algorithm as a spearhead decoding operation. The first bit-flipping algorithm can be different and distinguished from the second bit-flipping algorithm performed as the spearhead decoding operation. Through this procedure, complexity of a decoding operation required to search for and/or correct an error in the codeword (N, K) LDPC_CODE can be reduced. Accordingly, complexity regarding a decoder implemented in the controller 130 could be reduced.

With the introduction of high-speed applications such as memory device 150, there is a need for fast and low complexity error control coding. A message passing algorithm using a LDPC code for a decoding process, such as the sum-product algorithm (SPA), might have good error performance in a code where a degree of a VN is 4 or less. However, complexity of the algorithm may be high, or a decoding speed may be restricted. For 3-left-regular LDPC codes that allow lower complexity implementations, a message passing algorithm (or other types of decoding algorithms) can generally have a high error floor. Among existing decoding algorithms for LDPC codes of binary symmetric channels (BSCs), the bit-flipping algorithm can be the fastest and least complex, so it could be suitable for high-speed applications and fault-tolerant memory applications.

In the bit-flipping algorithm, a CN task can include a modulo-two additions operation (Bit XOR operation), and a VN task can include a simple comparison operation. Further, a decoding speed might not depend on a left/right degree of the code. The bit-flipping algorithm can reduce computational complexity when there is some soft information in a channel. To this end, an additional bit can be used in the bit-flipping algorithm to indicate a strength of the VN (e.g., reliability regarding a value of the VN). For example, when given a combination of satisfied and dissatisfied CNs, the bit-flip algorithm can reduce the strength of VNs before flipping them. To indicate reliability, an additional bit may also be used in the CN. According to an embodiment, a strength of the VN in a LDPC decoding is its ability to efficiently update and propagate information between the VNs and the CNs. The VN can update the probability distribution of each bit based on the messages it receives from the CNs, and then send updated messages back to the CNs. This can allow for iterative decoding algorithms to converge quickly and accurately to the correct codeword.

Figure 6:
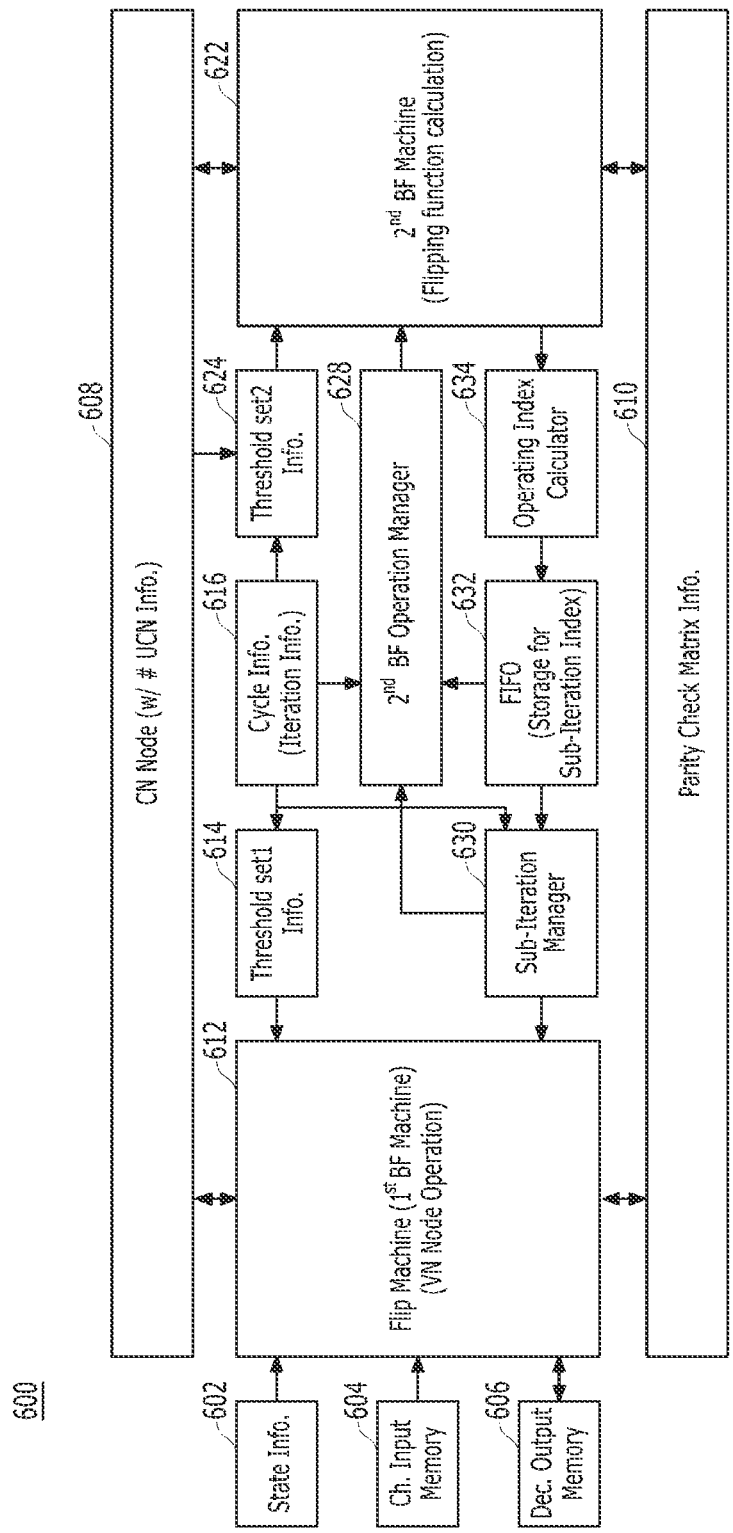
FIG. 6 describes an LDPC decoder according to another embodiment of the present invention.

FIG. 6 describes an LDPC decoder 600 according to another embodiment of the present invention.

Referring to FIG. 6, the LDPC decoder 600 can include an input memory 604 for storing input codewords, an output memory 606 for storing decoding results, and a state memory 602 for storing state information.

The LDPC decoder 600 can include a first flipping machine 612. The first flipping machine 612 may receive a codeword from the input memory 604 and perform an iterative operation on the codeword. According to an embodiment, the first flipping machine 612 may include either two separate processors which are used as a detector and a decoder respectively or a single processor used as both a detector and a decoder. The first flipping machine 612 may include a control circuitry configured to repeatedly correct and/or detect an error included in the codeword transmitted through a data path such as a channel or a way.

The first flipping machine 612 can perform an iterative operation for a decoding process based on CN information 608 and parity check matrix information 610. According to an embodiment, the iterative operation for the decoding process may be performed based on the LDPC code described in FIGS. 1 and 2. The LDPC decoding to generate a decoded message can be understood by referring to Equations 1 and 2 above described. The parity check matrix H included in the parity check matrix information 610 may be a low-density n×m matrix (e.g., 4×6 matrix in FIG. 2). In this case, 'n' may correspond to (N+K) bits, which is the length of the codeword (N, K) LDPC_CODE, where 'm' is the number of CNs that are satisfied. The parity check matrix H does not necessarily have to be unique. The parity check matrix H may be selected or designed for computational convenience in order to reduce the number of errors generated by a decoding technique of the LDPC decoder 600. According to an embodiment, the CN information 608 may include information (e.g., a number) regarding a satisfied CN and an unsatisfied CN (UCN).

An iterative decoding method used in the first flipping machine 612 may handle the codeword by updating symbols, reliability data, or both based on one or more FFs. The FF can be used to provide a reference or a threshold value for determining whether a symbol has been previously updated, flipped, or toggled based on a value of the reliability or the strength and whether a symbol's check has been satisfied or not based on any suitable combination thereof. Information on the reference or the threshold value for the FF may be stored in a first threshold value unit 614. The first flipping machine 612 may use information stored in the first threshold value unit 614 to perform an iterative operation. The first flipping machine 612 may reduce a total number of decoding iterations required to reach convergence based on a hard-decision decoding input, a reliability input, and decoding results so far. A detailed operation of the first flipping machine 612 will be described later, referring to FIGS. 7 to 10.

The LDPC decoder 600 may include a second flipping machine 622. Unlike the first flipping machine 612, the second flipping machine 622 can independently check or estimate the necessity and frequency of bit-flipping regarding the plurality of VNs based on the plurality of CNs. The second flipping machine 622 may refer to a second threshold value unit 624 in order to check the necessity and frequency of bit-flipping regarding the plurality of VNs. The second flipping machine 622 can check or estimate whether or not bit-flipping is performed based on an algorithm different from that used in the first flipping machine 612, rather than performing a part of the iterative operation performed by the first flipping machine 612 for a parallel processing. According to an embodiment, the first flipping machine 612 and the second flipping machine 622 may use a QC-LDPC code using a QC parity check matrix. An operation of the second flipping operator 622 will be described later, referring to FIGS. 11 to 13.

According to an embodiment, the first threshold value unit 614 and the second threshold value unit 624 may have different threshold values. The threshold values may vary according to iterative operations performed by the first flipping machine 612 and the second flipping machine 622. The first threshold value unit 614 or the second threshold value unit 624 may check iteration information (Iteration info.) or cycle information (Cycle info.) through a process check circuitry 616.

Referring to FIG. 6, the LDPC decoder 600 may establish the plurality of VNs and the plurality of CNs from the codeword. In addition, the LDPC decoder 600 can include the second flipping machine 622 configured to perform a second flipping function operation to check or estimate the necessity and frequency of bit-flipping for the plurality of VNs based on the plurality of CNs, and the first flipping machine 612 configured to perform only an iterative operation determined based on the necessity and frequency of bit-flipping, which is a result output from the second flipping machine 622, to determine the plurality of VNs.

According to an embodiment, the LDPC decoder 600 may further include a second flipping machine manager 628 configured to determine a second iteration operation index for the second flipping function operation to be performed by the second flipping machine 622. The second flipping machine 622 may perform a second iterative operation (e.g., iteration or sub-iteration) corresponding to the second iteration operation index determined by the second flipping machine manager 628. For example, the second flipping machine 622 can check or estimate whether bit-flipping is necessary for each VN based on the plurality of CNs, apart from the first flipping operation performed by the first flipping machine 612. After receiving the second iteration operation index for the iterative operation from the second flipping machine manager 628, the second flipping machine 622 can perform the iterative operation by referring to the value stored in the second threshold value unit 624 before the first flipping machine 612 performs the corresponding iterative operation. Through this procedure, the LDPC decoder 600 can check whether bit-flipping is necessary for correcting an error in the codeword through the second flipping function operation performed in advance by the second flipping machine 622.

According to an embodiment, the LDPC decoder 600 can further include an index determination logic 634 configured to determine a first iterative operation index (e.g., iteration or sub-iteration index) for the first flipping operation based on the flipping necessity and the flipping frequency estimated by the second flipping machine 622, and a task queue 632 configured to store the first iterative operation index determined by the index determination logic 634. The first flipping machine 612 may perform the first flipping operation including an iterative operation corresponding to the first iteration operation index stored in the task queue 632.

According to an embodiment, the index determination logic 634 may change or adjust the first iteration operation index and the second iteration operation index in response to the necessity and frequency of bit-flipping regarding the plurality of VNs. In this case, the task queue 632 may include a plurality of queues, each queue storing the first iteration operation index and the second iteration operation index respectively.

According to an embodiment, the second flipping machine manager 628 may adjust or change the second iteration operation index in response to a number of the iterative operations (e.g., an amount of calculation) corresponding to the first iteration operation indexes stored in the task queue 632. For example, when the task queue 632 for first iterative operations to be performed by the first flipping machine 612 is saturated, the number of second iterative operations to be performed by the second flipping machine 622 can be increased. If the number of the second iterative operations increases, a location and a probability regarding an error included in the codeword could be more specified. When information regarding the error is clearer, the number of first flipping operation performed by the first flipping machine 612 could be reduced.

According to an embodiment, the LDPC decoder 600 can further include a first flipping machine manager 630 configured to control the first flipping machine 612 for performing the first flipping operation including iterative operations corresponding to the first iteration operation index. Herein, the first flipping machine manager 630 may set or determine an iterative operation range of the first flipping operation, which is performed by the first flipping machine 612, corresponding to whether or not the second flipping machine 622 operates.

Figure 7:
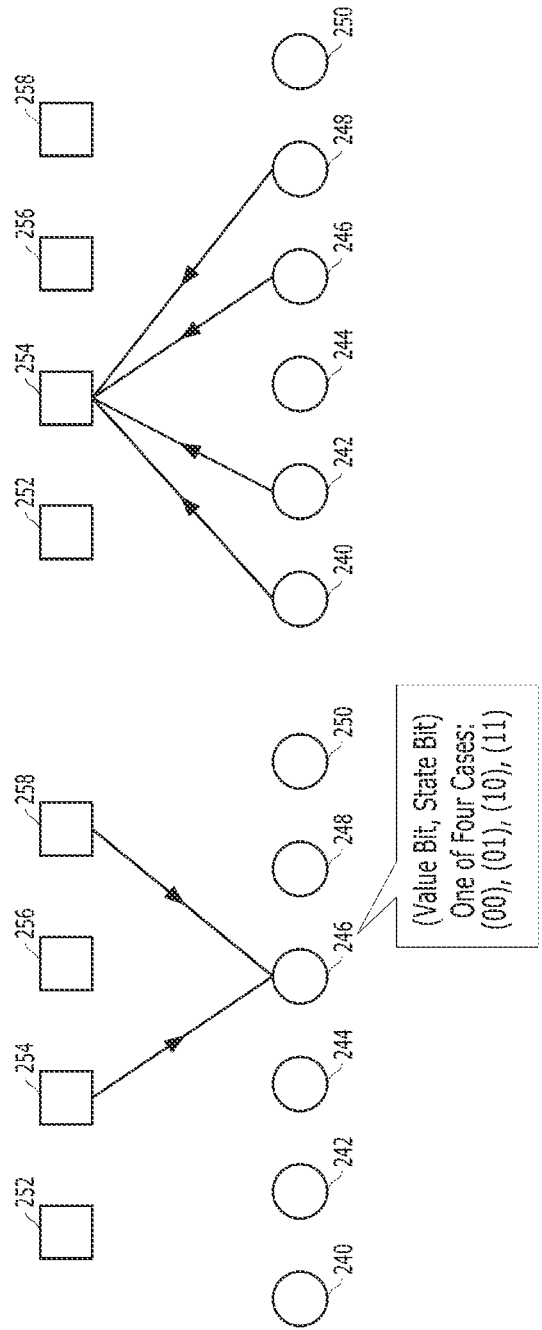
FIG. 7 describes a first example of operations performed by the first flipping machine described in FIG. 6.

FIG. 7 describes a first example of operations performed by the first flipping machine 612 described in FIG. 6. Specifically, FIG. 7 is a diagram showing an example of a parity check matrix H of an LDPC code including 4 rows and 6 columns described in FIG. 2 and a Tanner graph thereof. The operation of the first flipping machine 612 will be described with reference to FIGS. 1 to 7.

Referring to FIG. 2, the Tanner graph of an LDPC code encoded and decoded based on the parity check matrix H can include six VNs 240, 242, 244, 246, 248, 250 and four CNs 252, 254, 256, 258.

Upon initialization of a decoding process of the LDPC decoder 600, input states may be assigned to the VNs 240, 242, 244, 246, 248, 250 as described in FIG. 6. In this case, each VN can include a value bit, which is hard-decision decoding information, and a state bit indicating reliability information. The value bit can refer to hard-decision decoding associated with a VN, while the state bit can refer to reliability data associated with the corresponding VN or its variable as data regarding variable reliability. Initially, the state bit may be input from the state memory 602 and the value bit may be input from the input memory 604. As decoding progresses, the state bits and the value bit could be stored in a buffer or a cache in the LDPC decoder or in the output memory 606.

For example, every VN is associated with a 2-bit input denoted by ($y_0$ $y_1$), where the value of bit $y_0$ represents the hard decision and the value of bit $y_1$ represents the reliability (e.g., either strong or weak, or either reliable or unreliable) of the hard decision. In the binary code, $y_0$ can take a value of 0 or 1, which represents the two possible hard-decision states of the decoded bit. Accordingly, $y_1$ may have a value of 0 or 1. For example, '0' may indicate an unreliable decision and '1' may indicate a reliable decision. That is, if two bits of '10' are input to the VN, it can be interpreted as an unreliable decision of '1.' If '00' is input to the VN, it can be interpreted as an unreliable decision of '0.' If '01' is input to the VN, it can be interpreted as a reliable decision of '0.' If '10' is input into the VN, it is interpreted as an unreliable decision of '1.' If '11' is entered into the VN, it can be interpreted as a reliable decision of '1.'

In FIG. 6, the hard-decision information and the reliability information are respectively stored in the state memory 602 and the input memory 604, which are different memories. The hard-decision information and the reliability information can also be stored in a single memory. Further, although only 1 bit is used to represent hard-decision information and only 1 bit is used to represent reliability of hard-decision information as an example, any number of bits may be used according to an embodiment. For example, the hard decision information can have more than one value for non-binary codes, as well as the reliability information can be conveyed through one or more bits or symbols.

After VNs 240, 242, 244, 246, 248, 250 are assigned, as shown in FIG. 2, VN checking may be performed by the first flipping machine 612 in the LDPC decoder 600 for a plurality of VN groups. The first flipping machine 612 may use a FF, which is a processing rule, to determine whether to flip a VN. An indication of determined condition may be stored in a syndrome memory such as the CNs 252, 254, 256, 258. The parity check matrix H is used to identify which CNs store an indication of the determined condition regarding the VNs.

Referring to FIGS. 2 and 7, each row of the parity check matrix H corresponds to one of the CNs, and each column of the parity check matrix H corresponds to one of the VNs. In the case of a binary code, entries of the parity check matrix H are 0 or 1 as shown. A "neighboring" CN for a VN is the CN that is connected to the VN. Similarly, a "neighbor" VN for a CN is the VN that is connected to the CN. The parity check matrix H can provide an indication of the connection between the CN and the VN. In particular, as shown in FIG. 7, VNs 240, 242, 246, 248 are neighbors of a CN 254, and CNs 254, 258 are neighbors of a VN 248. Also, each CN in the binary code has one of two states: '0' if the check is satisfied; and '1' if the check is not satisfied. For non-binary code, the entries of the parity check matrix are non-binary and each CN has one of two or more states. Each row of the parity check matrix H may form a coefficient of a parity check equation calculated in a non-binary domain.

According to an embodiment, each CN may be further associated with one or more bits of CN reliability data. For example, if most of the VNs associated with the CN have unreliable variable values, calculated CN values may become marked as unreliable. Reliability of the CN value may be expressed by a corresponding single bit of the CN reliability data. In some embodiments, more than one bit of CN reliability data may be stored in the output memory 606, as well as updated through the decoding process. In FIG. 6, the output memory 606 can be implemented separately from the input memory 604 but may be implemented as a single integrated memory according to an embodiment.

The first flipping machine 612 can refer to the parity check matrix information 610 to identify at least one VN related to a specific CN or a VN to be checked by the specific CN. For example, with respect to the CN 254, the first bit-flipping machine 612 can determine a check result of the VNs 240, 242, 246, 248 (i.e., the 1st, 2nd, 4th, and 5th VNs). A value in the second row of the parity check matrix H can be a coefficient of the parity check equation and be multiplied by the corresponding value of each VN. For example, the arrows in FIG. 7 indicate that retrieved values flow from the VNs 240, 242, 246, 248 to the CN 254, so that it could be considered that the CN 254 can be used to check the VNs 240, 242, 246, 248. The value of the VN may be retrieved by the first flipping machine 612 which can calculate the value on behalf of the CN 254 according to a processing rule.

In addition, the first flipping machine 612 can read a CN information based on a given first iterative operation index (e.g., an iteration or sub-iteration index), and calculate a FF for the CN. After that, the first flipping machine 612 can store an operation result in the output memory 606 or an internal buffer, update state information for the CN and update the CN information.

From the values received from the VNs 240, 242, 246, 248, the first flipping machine 612 can determine whether a condition given to the CN 254 is satisfied or unsatisfied. An indication of whether the CN 254 is satisfied or unsatisfied (i.e., the CN's "syndrome value" or "CN value") is stored in CN information 608, which stores the CN's syndrome value or indication. In addition, reliability of the syndrome value of the CN could be updated based on values and reliability of the associated VNs.

After syndrome values for the CNs 252, 254, 256, 258 are stored in the CN information 608, the values of the VNs 240, 242, 244, 246, 248, 250 may be updated based on the reliability of the VN and the values of the CNs. The parity check matrix information 610 can be used again by the first flipping machine 612 to determine which CN should be accessed for a particular VN. Referring to FIGS. 2 and 7, the parity check matrix H can indicate that the CNs 254, 258 (i.e., the second and fourth CNs) should be referenced to update the VN 246. The state of VN 246 may be updated based on the indication of the referenced CN.

According to an embodiment, the value of VN 246 may be determined based on whether it has been previously updated, toggled, or flipped. CNs and VNs can be updated iteratively until all CNs are satisfied (i.e., an all-zero syndrome is achieved) or until the maximum number of iterations is reached. The output of the first flipping machine 612 may be stored in the output memory 606 as a hard decision result or a decoded message at the end of the decoding process.

According to an embodiment, one example of binary VN update based on the reliability of a single state bit is described. At the iteration j, the hard decision data or VN value of VN i is denoted by $y_0(i, j)$, while the reliability data of the VN i is denoted by $y_1(i, j)$. In a case of an iterative operation where $j>1$, relationship between the updated variable value $y_0(i, j)$ and the previous variable value $y_0(i, j-1)$ is as shown in Equation 3 below.

$$y_0(i,j)=y_0(i,j-1)\oplus f_{(0,j)}(y_0(i,j-1),y_1(i,j-1),u(i,j)) \quad \text{(Equation 3)}$$

where $u(i, j)$ denotes the total number of unsatisfactory checks associated with VN i at the iteration j, and $f(0, j)$ represents a FF for the variable value, an output value of the FF being 0 or 1 at the iteration j. The FF $f(0, j)$ could indicate whether the previous VN value should be flipped. According to an embodiment, a value or a result of the FF $f(0, j)$ for variable values may correspond to the number of unsatisfied CNs exceeding a predetermined threshold value. The FF $f(0, j)$ for the variable value may correspond to a pattern of unsatisfied CNs. The FF $f(0, j)$ for variable value may vary according to the iterative operation j.

Dependence of the FF $f(0, j)$ for the variable values on an input of the FF $f(0, j)$ can change during iterations performed between initialization and convergence of the decoding process. For example, during the initialization of the decoding process, VNs might be updated only if a number of relevant CNs are unsatisfied. According to an embodiment, the FF may be changed so that a VN is updated if at least one of the relevant CNs is unsatisfied after several iterations are performed based on a threshold value, a vector, iterative operation information, and a syndrome weight. According to an embodiment, an XOR operation can be performed between an output value of the FF $f(0, j)$ for the variable value and the last VN value to generate an updated VN value $y_0(i, j)$. According to another embodiment, the FF $f(0, j)$ for the variable value may directly generate the updated VN value $y_0(i, j)$.

According to an embodiment, reliability information for VNs may be updated. In this case, the relationship between the updated reliability data for VN $y_1(i, j)$ and the previous value for VN $y_1(i, j-1)$ can be expressed as Equation 4 below.

$$y_1(i,j)=y_1(i,j-1)\oplus f_{(1,j)}(y_0(i,j-1),y_1(i,j-1),u(i,j)) \quad \text{(Equation 4)}$$

Herein, $f(1, j)$ is a FF for VN reliability data and indicates whether the previous VN reliability data should be toggled or flipped. Similar to the FF of the variable value $f(0, j)$, the FF of VN reliability data can depend on the number of iterations already performed or directly generate updated VN reliability data $y_1(i, j)$.

According to an embodiment, in a case of a symmetric channel having a symmetric input, probability of detecting '0' in the first flipping machine 612 can be equal to probability of detecting '1.' In this case, $f(0, j)$ and $f(1, j)$, which are FFs of variable value and VN reliability data, may be independent of the variable value input $y_0(i, j)$. Therefore, the FFs determined by Equations 3 and 4 can be simplified to Equations 5 and 6 below.

$$y_0(i,j)=y_0(i,j-1)\oplus f_{(0,j)}(y_1(i,j-1),u(i,j)) \quad \text{(Equation 5)}$$

$$y_1(i,j)=y_1(i,j-1)\oplus f_{(1,j)}(y_1(i,j-1),u(i,j)) \quad \text{(Equation 6)}$$

In iteration j, the number of unsatisfactory checks $u(i, j)$ associated with VN i can have values from 0 to #D. Here, #D denotes the degree of VN i and corresponds to the column weight of the parity check matrix (H) in the LDPC code. Therefore, the second input to $f(0, j)$, $f(1, j)$, which are the FFs of variable value and VN reliability data, can have a range from 0 to #D in Equations 5 and 6. According to an embodiment, the FFs $f(0, j)$, $f(1, j)$, which are two bit-flip processing rules, may be implemented as a table as shown in FIG. 8.

Figure 8:
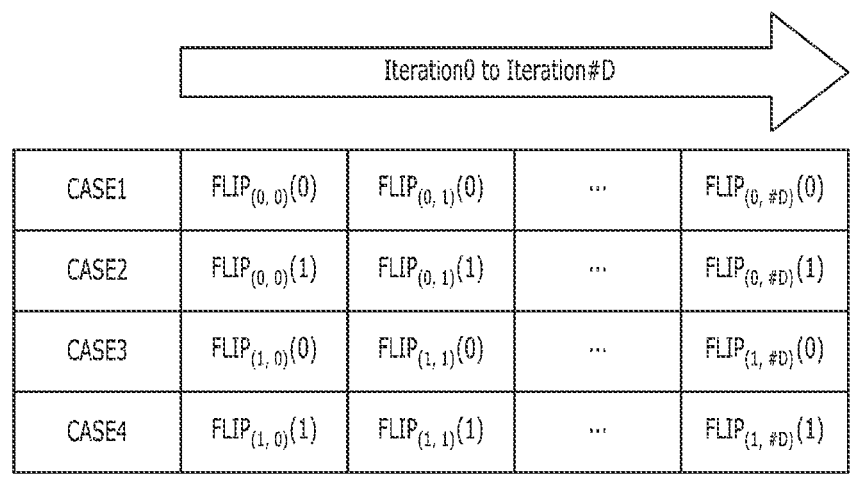
FIG. 8 describes a second example of operations performed by the first flipping machine described in FIG. 6.

FIG. 8 describes a second example of operations performed by the first flipping machine 612 described in FIG. 6. Specifically, FIG. 8 describes the FFs for four cases described in FIGS. 6 to 7. As described in FIG. 7, a VN may have one of four cases: '00', '01', '10', and '11'. Also, the FFs $f_{(0, j)}$, $f_{(1, j)}$ may vary according to iterative operations. Referring to FIG. 8, the iterative operations may proceed from 0 to #D. The variable value FF $f_{(0, j)}$ will be determined from $\text{FLIP}_{(0, 0)}$ to $\text{FLIP}_{(0, \#D)}$. The variable reliability data FF $f_{(1, j)}$ may be determined from $\text{FLIP}_{(1, 0)}$ to $\text{FLIP}_{(1, \#D)}$.

In a first case CASE1, $f_0(0)$ or $\text{FLIP}_0(0)$, which is the variable value FF in a case of low reliability '0', can be set from $\text{FLIP}_{(0, 0)}$ to $\text{FLIP}_{(0, \#D)}$. In a second case CASE2, the variable value FF $f_0(1)$ or $\text{FLIP}_0(1)$ can be set from $\text{FLIP}_{(0, 0)}$ to $\text{FLIP}_{(0, \#D)}$ in a case of high reliability '1'. A third case CASE3 can be set for the variable reliability data FF $f_1(0)$ or $\text{FLIP}_1(0)$ from $\text{FLIP}_{(1, 0)}$ to $\text{FLIP}_{(1, \#D)}$ in the case of low reliability '0'. A fourth case CASE4 can be set for the variable reliability data FF $f_1(1)$ or $FLIP_1(1)$ from $FLIP_{(1, 0)}$ to $FLIP_{(1, \#D)}$ in the case of high reliability '1'.

According to an embodiment, a substantially same FF $FLIP_{(0, x)}$ may be set for the first case CASE1 and the second case CASE2, and a substantially same FF $FLIP_{(1, x)}$ may be set for the third case CASE3 and the fourth case CASE4.

According to an embodiment, the FF set in FIG. 8 may be stored in the first threshold value unit 614 described in FIG. 6. The first flipping machine 612 may determine whether to flip the VN based on a threshold value stored in the first threshold value unit 614. For example, the FF can be selected in a real time depending on whether the VN i of the current iterative operation j (e.g., j is one of 0 to #D) is reliable. For example, when the VN is currently unreliable '0' and $FLIP_{(0, j)}(0, u(i, j))$, which is the FF of the variable value at the current iterative operation j, is 1, the first flipping machine 612 may flip a hard decision value or a variable value connected to the corresponding node. In addition, when the VN is currently unreliable '0' and $FLIP_{(1, j)}(0, u(i, j))$, which is the FF of the variable reliability data in the current iterative operation j, is 1, the first flipping machine 612 may flip reliability data of the corresponding node. In addition, when the VN is currently reliable '1' and $FLIP_{(0, j)}(1, u(i, j))$, which is the FF of the variable value in the current iterative operation j, is 1, the first flipping machine 612 may flip the variable value related to the corresponding node. In addition, when the VN is currently reliable '1' and $FLIP_{(1, j)}(1, u(i, j))$, which is the FF of the VN reliability data in the current iterative operation j, is 1, the first flipping machine 612 may flip reliability data of the corresponding node.

Figure 9:
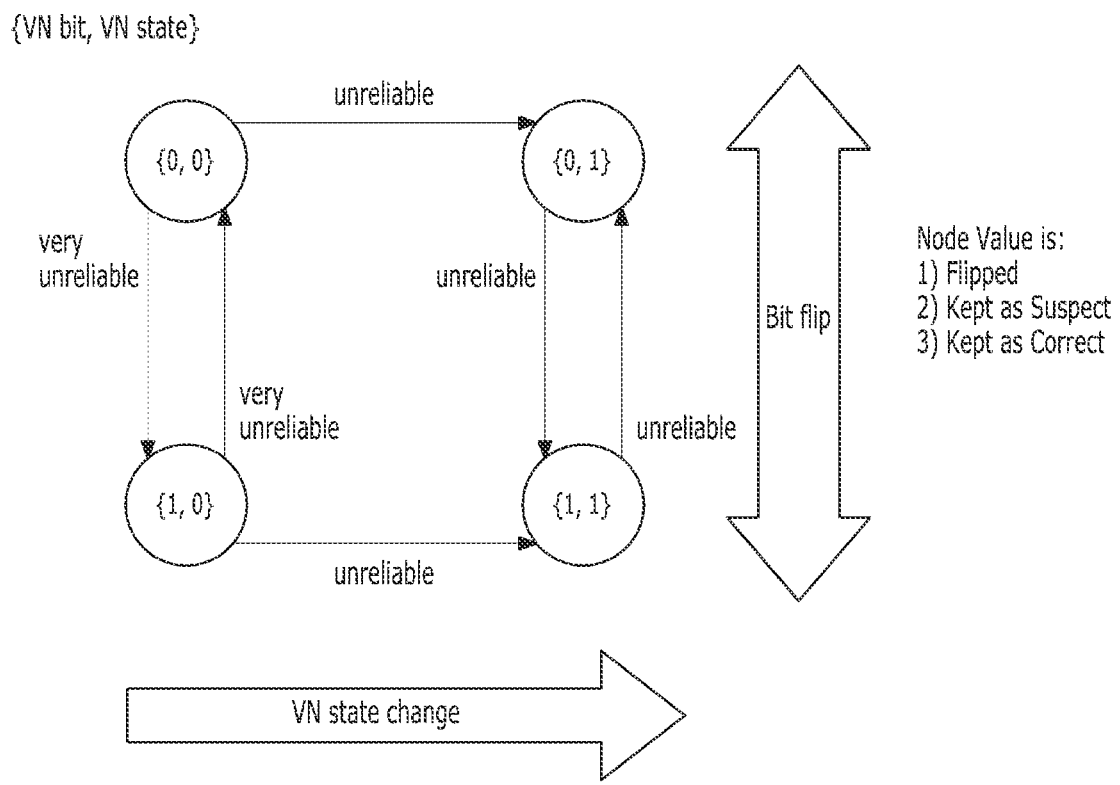
FIG. 9 describes a third example of operations performed by the first flipping machine described in FIG. 6.

FIG. 9 describes a third example of operations performed by the first flipping machine described in FIG. 6.

Specifically, when the VN includes a value bit (VN bit), which is hard-decision decoding information, and a state bit (VN state) indicating reliability data, FIG. 9 describes change, flipping, or toggle regarding the value bit or the status bit.

The first flipping machine 612 in the LDPC decoder 600 can change value bits of the VNs 240, 242, 244, 246, 248, 250 from '0' to '1' (state movement from top to bottom) or from '1' to '0' (moving state from bottom to top) in four cases. In addition, the first flipping machine 612 can change state bits of the VNs 240, 242, 244, 246, 248, 250 from '0' to '1' (state movement from left to right) and from '1' to '0' (state movement from right to left) in the four cases.

For example, to determine whether value bits are flipped, the first flipping machine 612 may determine flipping based on Equation 7 below.

$$V_{th}(i,j)=(N_{UCN}(i-1)+\alpha_j \times i) \times \beta_j \qquad \text{(Equation 7)}$$

Here, $V_{th}(i, j)$ is the j-th FF reference value in the i-th iterative operation, i is the current number of iterative operation, and j is an integer which is greater than or equal to 1 and less than or equal to N (i.e., the number of states that corresponding VNs can have). $N_{UCN}(i-1)$ is the number of unsatisfied CNs in the (i−1)th iterative operation. αj and βj are weights applied to the j-th FF reference. Herein, the αj and the βj may be preset, so that the first FF reference value has the highest value and the Nth FF reference value has the lowest value. Referring to Equation 7, it can be seen that the FF reference value is variable according to the number of current iterative operation, a previous iterative operation result, and the number of states that the corresponding VNs can have. Furthermore, at the first iterative operation, $N_{UCN}$ (0) can be the number of unsatisfactory CNs (i.e., the number of CNs having a value of '1') among initialized CNs included in the first data.

Also, for example, the first flipping machine 612 may determine whether to flip the state bit based on Equation 8 below.

$$R(i,k)=(\gamma j \times N_{UCN}(i-1,k)+\delta j \times N_{SCN}(i-1,k)) \qquad \text{(Equation 8)}$$

Here, R(i, k) is the reliability data of the k-th VN in the i-th iterative operation, i is the number of current iterative operation, and $N_{UCN}(i−1, k)$ is, at the (i−1)th iteration, the number of unsatisfied CNs connected to the k-th VN. $N_{SCN}(i−1, k)$ is the number of satisfied CNs connected to the k-th VN at the (i−1)th iterative operation. γj and δj are weights applied to the reliability data of the k-th VN. Referring to Equation 4, it can be seen that the reliability data of the k-th VN is changed according to the previous iterative operation result. Furthermore, in the first iterative operation, $N_{UCN}(0, k)$ is the number of unsatisfied CNs (i.e., the number of CNs having a value of '1') connected to the k-th VN included in the first data, and $N_{SCN}(0, k)$ is the number of satisfied CNs (that is, the number of CNs having a value of '0') connected to the k-th VN included in the first data.

As described above, when the first flipping machine 612 determines whether to flip the value bit and/or the status bit of the corresponding CN, the VN becomes flipped, kept in a suspicious/unreliable state (kept as suspect), or kept as correct or reliable (kept as correct).

Figure 10:
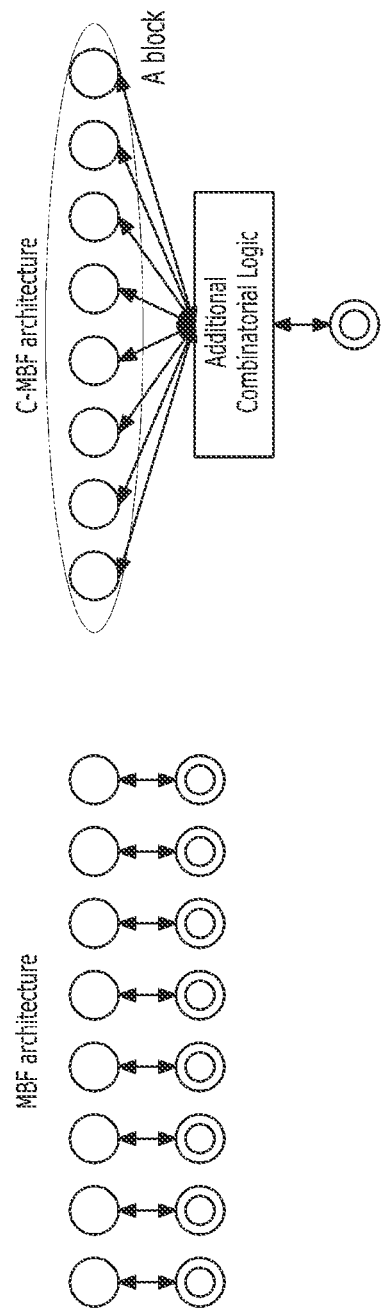
FIG. 10 describes a fourth example of operations performed by the first flipping machine described in FIG. 6.

FIG. 10 describes a fourth example of operations performed by the first flipping machine described in FIG. 6. Specifically, FIG. 10 describes two different types of VNs in relation to the operation performed by the first flipping machine 612.

As described above, in the first flipping machine 612 in the LDPC decoder 600, each of the VNs 240, 242, 244, 246, 248, 250 have four cases of '00,' '01,' '10,' and '11.' As an example, each of the plurality of VNs 240, 242, 244, 246, 248, 250 has a value bit or a variable value (○) and a state bit or reliability data (◉) which can be different. In addition, in another embodiment, when each of the plurality of VNs 240, 242, 244, 246, 248, 250 belonging to one group (e.g., A block), each of the plurality of VNs 240, 242, 244, 246, 248, 250 can have a different value bit or variable value (○), but a same/common reliability data (◉). To this end, the first flipping machine 612 may include an additional combinatorial logic for handling common reliability data. The additional combinatorial logic may determine common reliability data for a corresponding group through a logical operation based on reliability data for the plurality of VNs 240, 242, 244, 246, 248, 250 which belongs to a same group (e.g., A block).

According to an embodiment, a group may be set based on whether VNs are output via a same data path such as a channel or way, from a same memory die, or from a same memory block. If each group has a same reliability data, the first flipping machine 612 may simplify an iterative operation for VNs.

Figure 11:
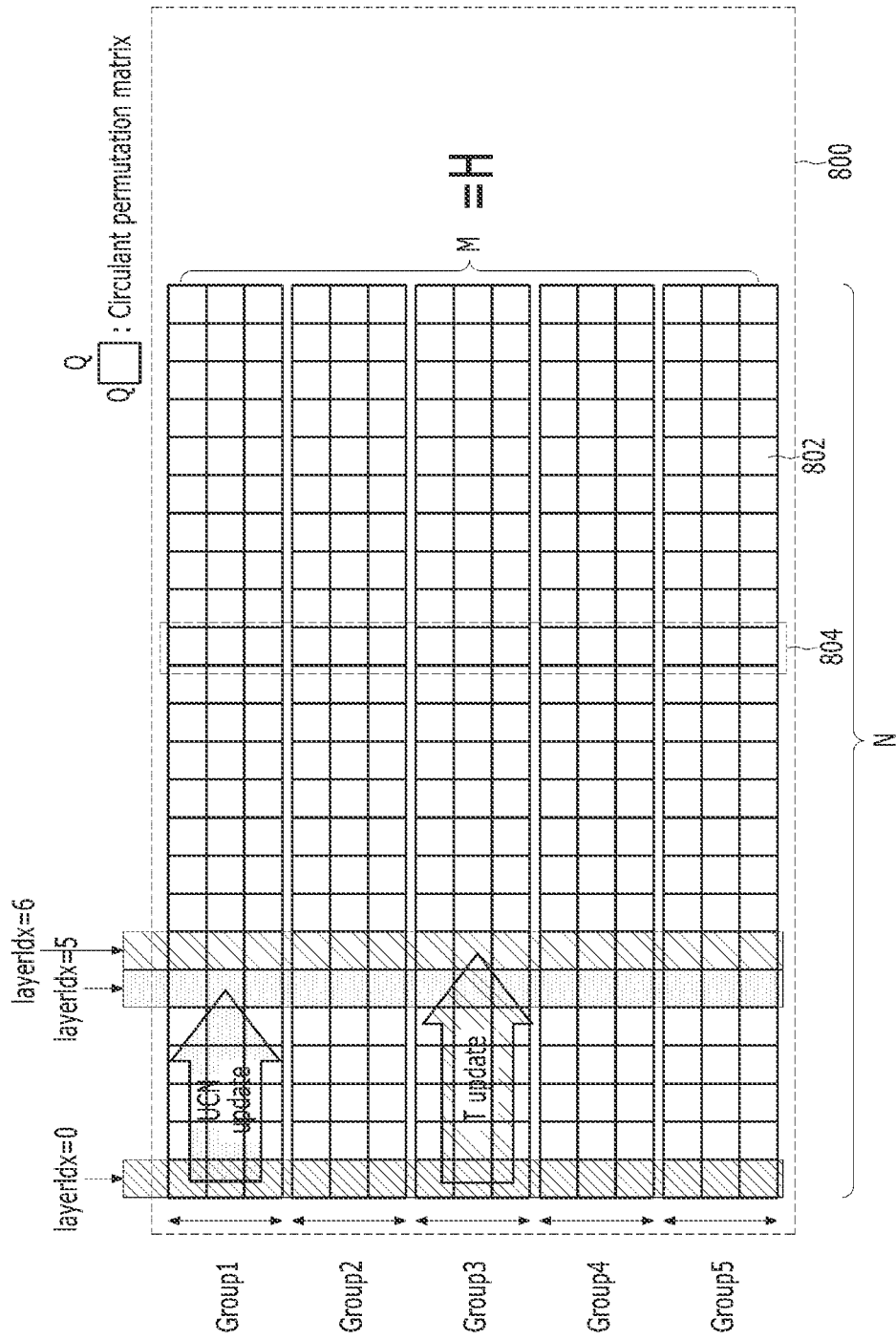
FIG. 11 describes a first example of operations performed by the second flipping machine described in FIG. 6.

FIG. 11 describes a first example of operations performed by the second flipping machine described in FIG. 6.

Referring to FIG. 11, a parity check matrix 800 can include M×N sub-matrices 802, each of which has a zero matrix or a cyclically shifted identity matrix of Q×Q dimension. According to an embodiment, a parity check matrix of a QC form may be used as the parity check matrix 800 for ease of implementation. The parity check matrix 800 can be characterized by having a parity check matrix including zero matrices or CPMs of Q×Q dimension. In this case, the permutation matrix can include all entries of 0 or 1 and each row or column includes only one 1. Also, a CPM can include a matrix obtained by circularly shifting each entry of an identity matrix to the right. Referring to FIG. 2, a structure of the LDPC code may be defined by a Tanner graph including CNs, VNs, and edges connecting the CNs and VNs.

CNs and VNs constituting the Tanner graph may respectively correspond to rows and columns of the parity check matrix 800. Accordingly, the number of rows and columns of the parity check matrix 800 can coincide with the number of CNs and VNs constituting the Tanner graph, respectively. When an entry of the parity check matrix 800 is 1, CNs and VNs connected by edges on the Tanner graph can correspond to the row and column where the entry of '1' is located, respectively.

According to an embodiment, the second flipping machine 622 in the LDPC decoder 600 may perform a LDPC decoding operation according to a bit-flipping algorithm using a vertical-shuffled scheduling method. According to the vertical-shuffled scheduling method, the second flipping machine 622 can perform a VN selection operation for selecting VNs corresponding to columns 804 constituting selected sub-matrices by selecting the selected sub-matrices sharing a same layer (layerIdx=0, layerIdx=5, layerIdx=6). The second flipping machine 622 may calculate a FF based on CNs connected to the selected VNs. The second flipping machine 622 may refer to the values of the VN and the CN already calculated by the first flipping machine, but does not modify or update the values of the VN and/or the CN. The second flipping machine 622 may determine in advance, e.g., estimate, whether to flip VNs based on the CN messages which are provided to the VNs receiving the CN messages. The second flipping machine 622 can perform the LDPC decoding process in a vertical-shuffled-scheduled manner by repeatedly performing the VN selection operation, a CN update check operation, and a VN update check operations until the LDPC decoding succeeds.

A BF-based algorithm for decoding LDPC codes can update all VNs and CNs in parallel. According to an embodiment, the group shuffled (GS) BF algorithm can divide VNs into groups and serially perform decoding operations for each group, so that the decoding iterative operation (e.g., an iteration) can be effectively converted into several sub-iterative operations (e.g., sub-iterations). Therefore, the second flipping machine 622 performing group shuffle bit-flipping (GSBF) decoding operation can transfer a newly updated message obtained from the sub-iteration operation to a neighboring group of the subsequent sub-iteration operation, while reducing parallel decoding complexity, thereby achieving faster convergence.

For example, the second flipping machine 622 can divide one iteration into sub-iterations in units of columns of sub-matrices 802 in the parity check matrix 800, and update bit-flipping, an unsatisfied CN (UCN), and a threshold value (T) whenever a sub-iterative operation is performed. According to an embodiment, the second flipping machine 622 may configure a sub-iteration operation in a unit corresponding to a cycle of the CPM. Through this configuration, computational complexity of the second flipping machine 622 may be reduced.

According to an embodiment, in one column 804 of the parity check matrix H shown in FIG. 11, the CNs can be divided into different groups Group1, Group2, Group3, Group4, Group5. The number of non-zero CPMs that exists in a group can be limited to a maximum of 1 (i.e., the number of non-zero CPMs in each group is 0 or 1). Through this code, it is possible to reduce the complexity of the LDPC decoder 600 by arranging a single CN calculator for a CPM unit per group.

Figure 12:
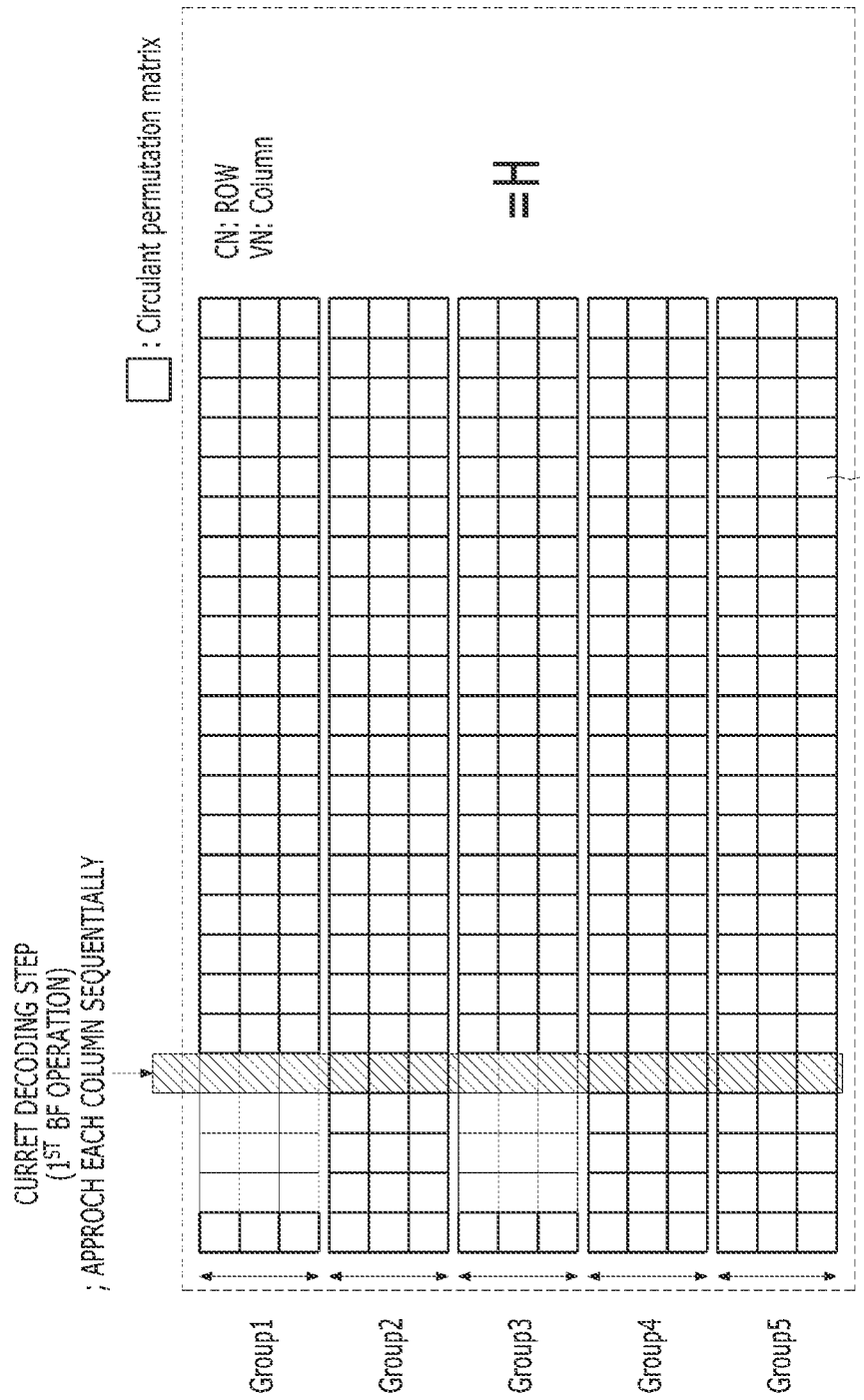
FIG. 12 describes a second example of operations performed by the second flipping machine described in FIG. 6.

FIG. 12 describes a second example of operations performed by the second flipping machine described in FIG. 6.

Referring to FIG. 12, the parity check matrix H may have rows corresponding to the number of CNs and columns corresponding to the number of VNs.

Referring to FIGS. 6 and 12, the LDPC decoder 600 may include the first flipping machine 612 and the second flipping machine 622. The first flipping machine 612 can receive the codeword from the input memory 604 and perform an iterative operation. The second flipping machine 622 can perform a spearhead decoding operation compared to the first flipping machine. The first flipping machine 612 can limitedly perform an iterative operation for bit-flipping based on a result of the spearhead decoding operation performed by the second flipping machine 622. For example, the first flipping machine 612 can skip some of iterative operations based on the result output by the second flipping machine 622.

When the codeword is initially received from the input memory 604, there is no result of the spearhead decoding operation performed by the second flipping machine 622. Accordingly, the first flipping machine 612 may perform an iterative operation corresponding to the first column based index (layerIdx=0). In order to avoid redundant repetitive operations, the second flipping machine 622 can jump over or skip some of iterative operations from the first column based index (layerIdx=1) to a preset k-th based index (layerIdx=k), because the first flipping machine 612 would perform the iterative operations from the first column based index (layerIdx=1) to a preset k-th based index (layerIdx=k). For example, referring to FIG. 12, when the first flipping machine 612 performs an iterative operation corresponding the first column based index (layerIdx=0), the second flipping machine 622 can perform an iterative operation corresponding to the 5th column (i.e., jump over iterative operations corresponding to the 1st to 4th columns).

Figure 13:
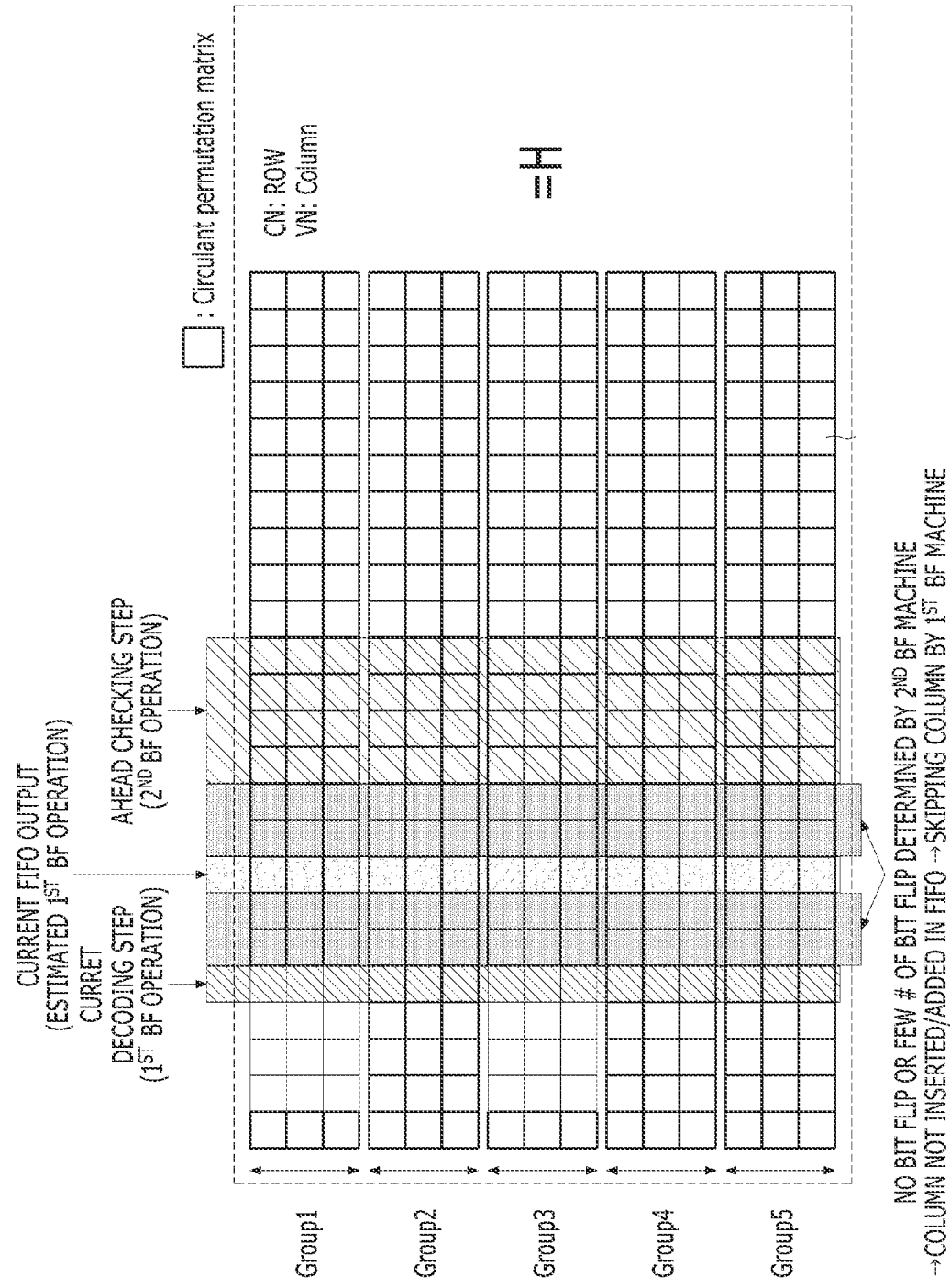
FIG. 13 describes a third example of operations performed by the second flipping machine described in FIG. 6.

FIG. 13 describes a third example of operations performed by the second flipping machine described in FIG. 6.

Referring to FIGS. 6, 12, and 13, the operations are described based on the parity check matrix H in relation to iterative operations performed by the first flipping machine 612 and the second flipping machine 622 included in the LDPC decoder 600.

At a specific time point, the first flipping machine 612 can perform a decoding operation by performing an iterative operation corresponding to the fifth column of the parity check matrix H, while the second flipping machine performs a spearhead decoding operation by performing iterative operations corresponding to the 11th to 14th columns in the parity check matrix H. In addition, the second flipping machine 622 has already performed iterative operations corresponding to the 6th to 10th columns, so that information regarding repetitive operations to be performed by the first flipping machine 612 (i.e., a result of the spearhead decoding operation) may be stored in the task queue 632.

Referring to FIG. 13, the operation result of the second flipping machine 622 among the iterative operations corresponding to the 6th to 10th columns can show that some iterative operations corresponding to the 6th to 7th and 9th to 10th columns do not need to be performed by the first flipping machine 612 except for the iterative operation corresponding to the 8th column. That is, the information regarding the iterative operation corresponding to the eighth column only may be stored in the task queue 632, and the first flipping machine can perform iterative operations corresponding to the only iterative operation index included in the task queue 632 (e.g., repetition operations corresponding to the 6th to 7th and 9th to 10th columns are omitted or skipped).

According to an embodiment, referring to FIGS. 12 and 13, the task queue 632 can include information regarding iterative operations corresponding to the first column in the parity check matrix H up to a preset k-th column which the second flipping machine 622 does not determine whether flipping is necessary. After the preset k-th column, the task queue 632 can include information regarding iterative operations to be performed by the first flipping machine 612 in response to the operation result of the second flipping machine 622. Information on the iterative operation corresponding to the required column may be included. Through the task queue 632, the first flipping machine 612 does not perform iterative operations corresponding to all columns in the parity check matrix H but can perform iterative operations corresponding to some columns in the parity check matrix H, which are stored in the task queue 632. Based on this procedure, the number of iterative operations performed by the LDPC decoder 600 can be reduced and the complexity of the LDPC decoder 600 can be improved.

As above described, complexity of a controller could be reduced by reducing an amount of computation consumed to check and correct errors included in data transmitted from a memory device of a memory system according to an embodiment of the present invention.

In addition, a LDPC decoder according to an embodiment of the present invention can include a plurality of bit-flipping machines. Ranges of iterative operations based on parity check matrices performed by the plurality of bit-flipping machines are different from each other. A number of iterative operations in the LDPC decoder (e.g., an amount of computation in the LDPC decoder) could be reduced based on different ranges of iterative operations, so that complexity of the LDPC decoder could be improved.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory system, comprising:
   a memory device configured to output a codeword read from plural memory cells in response to a request; and
   a controller configured to:
   establish a plurality of variable nodes and a plurality of check nodes from the codeword;
   perform a second flipping function operation for estimating flipping necessity and flipping frequency regarding the plurality of variable nodes based on the plurality of check nodes, wherein the flipping necessity indicates whether to flip at least one of the variable nodes to correct an error in the codeword and wherein the flipping frequency indicates an amount of bit-flipping to be applied to the variable nodes;
   determine, based on the flipping necessity and the flipping frequency, which iterative operation is performed during a first flipping operation for decoding the codeword; and
   perform the first flipping operation through a determined iterative operation to obtain the plurality of variable nodes.

2. The memory system according to claim 1, wherein the controller comprises:
   a second flipping machine manager configured to determine a second iterative operation index for the second flipping function operation;
   a second flipping machine configured to perform the second flipping function operation through second iterative operations corresponding to the second iterative operation index to estimate the flipping necessity and the flipping frequency;
an index determination logic configured to determine a first iterative operation index for the first flipping operation based on the flipping necessity and the flipping frequency;
a task queue configured to store the first iterative operation index; and
a first flipping machine configured to perform the first flipping operation through the determined iterative operation corresponding to the first iterative operation index.

3. The memory system according to claim 2,
wherein the index determination logic is further configured to change or adjust the second iterative operation index based on the flipping necessity and the flipping frequency, and
wherein the task queue comprises plural queues for respectively storing the first iterative operation index and the second iterative operation index.

4. The memory system according to claim 3, wherein the second flipping machine manager is configured to change or adjust the second iterative operation index based on a number of the iterative operation corresponding to the first iterative operation index stored in the task queue.

5. The memory system according to claim 2, wherein the controller further comprises a first flipping machine manager configured to:
control the first flipping machine to perform the first flipping operation through the iterative operation corresponding to the first iterative operation index, and
determine a range of the first flipping operation based on whether the second flipping function operation is performed by the second flipping machine.

6. The memory system according to claim 1,
wherein the controller is configured to:
perform the first flipping operation using a two-bit weighted bit-flipping algorithm in which each of the plurality of variable nodes includes a value bit and a state bit, and
perform the second flipping function operation using a column-layered group shuffled bit-flipping algorithm that performs iterative operations in a unit of columns of a circulant permutation matrix (CPM).

7. The memory system according to claim 6, wherein a first threshold value used for flipping in the first flipping operation is different from a second threshold value used for flipping estimation in the second flipping function operation.

8. The memory system according to claim 6, wherein the plurality of variable nodes shares a common state bit during the first flipping operation.

9. The memory system according to claim 6, wherein the controller is configured to perform the second flipping operation by performing sub-iterations corresponding to a cycle of the circulant permutation matrix (CPM) to update the flipping necessity, a number of unsatisfied check nodes, and a second threshold value.

10. The memory system according to claim 1,
wherein the controller performs the first flipping operation starting from an iterative operation corresponding to a first column of a parity check matrix, and
wherein the controller performs the second flipping function operation starting from an iterative operation corresponding to a column located a predetermined number of columns apart from the first column in the parity check matrix.

11. A method for decoding a codeword, comprising:
establishing a plurality of variable nodes and a plurality of check nodes from the codeword;
performing a second flipping function operation for estimating flipping necessity and flipping frequency regarding the plurality of variable nodes based on the plurality of check nodes, wherein the flipping necessity indicates whether to flip at least one of the variable nodes to correct an error in the codeword and wherein the flipping frequency indicates an amount of bit-flipping to be applied to the variable nodes;
determining, based on the flipping necessity and the flipping frequency, which iterative operation is performed during a first flipping operation for decoding the codeword; and
performing the first flipping operation through a determined iterative operation to obtain the plurality variable nodes.

12. The method according to claim 11, further comprising determining a second iterative operation index for the second flipping function operation,
wherein the second flipping function operation is performed through second iterative operations corresponding to the second iterative operation index.

13. The method according to claim 12,
wherein the determining which iterative operation is performed during the first flipping operation comprises:
determining a first iterative operation index for the first flipping operation based on the flipping necessity and the flipping frequency; and
storing the first iterative operation index in a task queue, and
wherein the first flipping operation includes the iterative operation only corresponding to the first iterative operation index.

14. The method according to claim 13, further comprising changing or adjusting the second iterative operation index based on the flipping necessity and the flipping frequency.

15. The method according to claim 13, further comprising changing or adjusting the second iterative operation index based on a number of the iterative operations corresponding to the first iterative operation index stored in the task queue.

16. The method according to claim 11,
wherein the first flipping operation is performed based on a two-bit weighted bit-flipping algorithm in which each of the plurality of variable nodes includes a value bit and a state bit, and
wherein the second flipping function operation is performed based on a column-layered group shuffled bit-flipping algorithm that performs iterative operations in a unit of columns of a circulant permutation matrix (CPM).

17. The method according to claim 11,
wherein the first flipping operation is performed starting from an iterative operation corresponding to a first column of a parity check matrix, and
wherein the second flipping function operation is performed starting from an iterative operation corresponding to a column located a predetermined number of columns apart from the first column in the parity check matrix.

18. A Low-Density Parity-Check (LDPC) decoder, comprising at least one processor and at least one memory having stored instructions operative, when executed by the at least one processor, to cause the LDPC decoder to:
receive a codeword generated based on a parity check matrix;

establish a plurality of variable nodes and a plurality of check nodes from the codeword;

perform a second flipping function operation for estimating flipping necessity and flipping frequency regarding the plurality of variable nodes based on the plurality of check nodes, wherein the flipping necessity indicates whether to flip at least one of the variable nodes to correct an error in the codeword and wherein the flipping frequency indicates an amount of bit-flipping to be applied to the variable nodes;

determine, based on the flipping necessity and the flipping frequency, which iterative operation is performed during a first flipping operation for decoding the codeword; and perform the first flipping operation through a determined iterative operation to obtain the plurality variable nodes.

19. The LDPC decoder according to claim 18,
wherein the first flipping operation is performed starting from an iterative operation corresponding to a first column of the parity check matrix, and
wherein the second flipping function operation is performed starting from an iterative operation corresponding to a column located a predetermined number of columns apart from the first column within the parity check matrix.

20. The LDPC decoder according to claim 18, further comprising a task queue configured to store information corresponding to the determined iterative operation to be performed during the first flipping operation, the determined iterative operation corresponding to a column of the parity check matrix and a result of the second flipping function operation.

* * * * *